(12) United States Patent
Cho et al.

(10) Patent No.: US 11,765,946 B2
(45) Date of Patent: Sep. 19, 2023

(54) DISPLAY DEVICE

(71) Applicant: Samsung Display Co., LTD., Yongin-si (KR)

(72) Inventors: Yoon-Jong Cho, Seongnam-si (KR); Seok Je Seong, Seongnam-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/085,749

(22) Filed: Dec. 21, 2022

(65) Prior Publication Data
US 2023/0131807 A1    Apr. 27, 2023

Related U.S. Application Data

(63) Continuation of application No. 16/997,385, filed on Aug. 19, 2020, now Pat. No. 11,538,882.

(30) Foreign Application Priority Data

Feb. 26, 2020    (KR) .................. 10-2020-0023591

(51) Int. Cl.
*H10K 59/126* (2023.01)
*G09G 3/3233* (2016.01)
(Continued)

(52) U.S. Cl.
CPC ......... *H10K 59/126* (2023.02); *G09G 3/3233* (2013.01); *H10K 59/1213* (2023.02);
(Continued)

(58) Field of Classification Search
CPC ............ H10K 59/126; H10K 59/1213; H10K 50/865; H10K 59/12; H10K 59/1216;
(Continued)

(56) References Cited

U.S. PATENT DOCUMENTS

2015/0364091 A1    12/2015    Won et al.
2018/0308916 A1*   10/2018    Kim ..................... H10K 59/124
(Continued)

FOREIGN PATENT DOCUMENTS

JP     2018-74076       5/2018
KR    10-2006-0056790   5/2006
(Continued)

*Primary Examiner* — Douglas M Wilson
(74) *Attorney, Agent, or Firm* — KILE PARK REED & HOUTTEMAN PLLC

(57) ABSTRACT

A display device includes a polycrystalline semiconductor including a channel and electrodes of a driving transistor; a gate electrode of the driving transistor on the channel of the driving transistor; a first storage electrode on the gate electrode of the driving transistor; a light blocking layer of a first transistor and a light blocking layer of a second transistor; an oxide semiconductor including a channel and electrodes of the first transistor, and a channel and electrodes of the second transistor; a gate electrode of the first transistor on the channel of the first transistor; and a gate electrode of the second transistor on the channel of the second transistor. The light blocking layer of the first transistor and the first storage electrode are on a same layer, and the light blocking layer of the second transistor and the gate electrode of the driving transistor are on a same layer.

10 Claims, 9 Drawing Sheets

(51) Int. Cl.
*H10K 59/121* (2023.01)
*H01L 27/12* (2006.01)
*H01L 29/786* (2006.01)
*H01L 29/04* (2006.01)
*G09G 3/3208* (2016.01)
*H10K 50/86* (2023.01)
*H10K 59/12* (2023.01)
*H10K 59/131* (2023.01)

(52) U.S. Cl.
CPC ... *G09G 3/3208* (2013.01); *G09G 2300/0426* (2013.01); *G09G 2300/0819* (2013.01); *G09G 2300/0852* (2013.01); *G09G 2310/0254* (2013.01); *G09G 2320/0238* (2013.01); *H01L 27/1222* (2013.01); *H01L 27/1225* (2013.01); *H01L 27/1251* (2013.01); *H01L 29/04* (2013.01); *H01L 29/7869* (2013.01); *H01L 29/78672* (2013.01); *H01L 29/78675* (2013.01); *H10K 50/865* (2023.02); *H10K 59/12* (2023.02); *H10K 59/1216* (2023.02); *H10K 59/131* (2023.02)

(58) Field of Classification Search
CPC .. H10K 59/131; G09G 3/3233; G09G 3/3208; G09G 2300/0426; G09G 2300/0819; G09G 2300/0852; G09G 2310/0254; G09G 2320/0238; H01L 27/1222; H01L 27/1225; H01L 27/1251; H01L 29/04; H01L 29/78672; H01L 29/78675; H01L 29/7869

See application file for complete search history.

(56) References Cited

U.S. PATENT DOCUMENTS

| | | |
|---|---|---|
| 2019/0073957 A1 | 3/2019 | Yang et al. |
| 2019/0237530 A1 | 8/2019 | Tsuno |
| 2020/0176699 A1* | 6/2020 | Lee .................. H10K 59/131 |
| 2021/0142734 A1 | 5/2021 | Cho et al. |
| 2021/0202541 A1* | 7/2021 | Lim .................. H01L 27/1255 |
| 2021/0210513 A1 | 7/2021 | Ikeda et al. |

FOREIGN PATENT DOCUMENTS

| | | |
|---|---|---|
| KR | 10-2018-0119192 | 11/2018 |
| KR | 10-2019-0042132 | 4/2019 |
| KR | 10-2019-0073848 | 6/2019 |

* cited by examiner

DISPLAY DEVICE

CROSS-REFERENCE TO RELATED APPLICATION(S)

This is a continuation application of U.S. patent application Ser. No. 16/997,385, filed Aug. 19, 2020 (now pending), the disclosure of which is incorporated herein by reference in its entirety. U.S. patent application Ser. No. 16/997,385 claims priority to and benefit of Korean Patent Application No. 10-2020-0023591 under 35 U.S.C. § 119, filed on Feb. 26, 2020, in the Korean Intellectual Property Office, the entire contents of which are incorporated herein by reference.

BACKGROUND

1. Technical Field

The disclosure relates to a display device.

2. Description of the Related Art

An organic light emitting device may include two electrodes and an organic emission layer disposed therebetween, and electrons injected from one electrode may be combined with holes injected from the other electrode on an organic emission layer to form excitons. The excitons may transition to a ground state from an excited state to output energy and emit light.

The organic light emitting device may include pixels including an organic light emitting diode that may be a self-light-emitting device, and transistors and at least one capacitor that may drive the organic light emitting diode may be formed or disposed on respective pixels. The transistors may include a switching transistor and a driving transistor.

A number of pixels may be increased to increase a resolution of the organic light emitting device, an aperture ratio may be reduced in a high-speed driving process to realize stable video, a current density may be increased, and a driving voltage may increase. Accordingly, stains may be generated, and reliability of elements such as transistors may be deteriorated.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to drive a display device in a stable way, improve reliability, and reduce power consumption.

An embodiment may provide a display device that may include: a driving transistor disposed on a substrate; a polycrystalline semiconductor including a channel, a first electrode, and a second electrode of the driving transistor; a gate electrode of the driving transistor positioned on the channel of the driving transistor; a first storage electrode positioned on the gate electrode of the driving transistor; a light blocking layer of a first transistor and a light blocking layer of a second transistor positioned on the substrate; an oxide semiconductor including a channel, a first electrode, and a second electrode of the first transistor positioned on the light blocking layer of the first transistor; and a channel, a first electrode, and a second electrode of the second transistor positioned on the light blocking layer of the second transistor; a gate electrode of the first transistor positioned on the channel of the first transistor; and a gate electrode of the second transistor positioned on the channel of the second transistor, wherein the light blocking layer of the first transistor and the first storage electrode may be positioned on a same layer, and the light blocking layer of the second transistor and the gate electrode of the driving transistor may be positioned on a same layer.

The driving transistor may be a p-type transistor, and the first transistor and the second transistor may be an n-type transistor.

The light blocking layer of the first transistor may overlap the channel of the first transistor and the gate electrode of the first transistor, and the light blocking layer of the second transistor may overlap the channel of the second transistor and the gate electrode of the second transistor.

The display device may further include: a first gate insulating layer positioned between the polycrystalline semiconductor and the gate electrode of the driving transistor; a second gate insulating layer positioned between the gate electrode of the driving transistor and the first storage electrode; a first interlayer insulating layer positioned between the light blocking layer of the first transistor and the oxide semiconductor and between the light blocking layer of the second transistor and the oxide semiconductor; a third gate insulating layer positioned between the oxide semiconductor and the gate electrode of the first transistor and between the oxide semiconductor and the gate electrode of the second transistor; and a second interlayer insulating layer positioned on the gate electrode of the first transistor and the gate electrode of the second transistor.

The display device may further include a connection electrode that may electrically connect the second electrode of the driving transistor and the first electrode of the first transistor.

The display device may further include: a first opening formed in the first gate insulating layer, the second gate insulating layer, the first interlayer insulating layer, the third gate insulating layer, and the second interlayer insulating layer to overlap the second electrode of the driving transistor; and a second opening formed in the third gate insulating layer and the second interlayer insulating layer to overlap the first electrode of the first transistor, wherein the connection electrode may be positioned on the second interlayer insulating layer, may be electrically connected to the second electrode of the driving transistor through the first opening, and may be electrically connected to the first electrode of the first transistor through the second opening.

An embodiment may provide a display device that may include: a driving transistor disposed on a substrate; a polycrystalline semiconductor including a channel, a first electrode, and a second electrode of the driving transistor; a gate electrode of the driving transistor positioned on the channel of the driving transistor; a first storage electrode positioned on the gate electrode of the driving transistor; a light blocking layer of a first transistor and a light blocking layer of a second transistor positioned on the substrate; an oxide semiconductor including a channel, a first electrode, and a second electrode of the first transistor positioned on the light blocking layer of the first transistor; and a channel, a first electrode, and a second electrode of the second transistor positioned on the light blocking layer of the second transistor; a gate electrode of the first transistor positioned on the channel of the first transistor; and a gate electrode of the second transistor positioned on the channel of the second transistor, wherein an inverted scan signal may be applied to the light blocking layer of the first transistor and the gate electrode of the first transistor, and a first emission control signal may be applied to the light blocking layer of the second transistor and the gate electrode of the second transistor.

The driving transistor may be a p-type transistor, and the first transistor and the second transistor may be an n-type transistor.

The light blocking layer of the first transistor may overlap the channel of the first transistor and the gate electrode of the first transistor, and the light blocking layer of the second transistor may overlap the channel of the second transistor and the gate electrode of the second transistor.

The light blocking layer of the first transistor and the light blocking layer of the second transistor may be positioned on different layers.

The light blocking layer of the first transistor and the first storage electrode may be positioned on a same layer, and the light blocking layer of the second transistor and the gate electrode of the driving transistor may be positioned on a same layer.

The display device may further include an inverted scan line extending in a direction on the substrate, and receiving the inverted scan signal, wherein the light blocking layer and the gate electrode of the first transistor may be electrically connected to the inverted scan line.

The inverted scan line may include: a lower inverted scan line; and an upper inverted scan line that may overlap the lower inverted scan line, the lower inverted scan line, the light blocking layer of the first transistor and the first storage electrode may be positioned on a same layer, the upper inverted scan line and the gate electrode of the first transistor may be positioned on a same layer, the light blocking layer of the first transistor may be electrically connected to the lower inverted scan line, and the gate electrode of the first transistor may be electrically connected to the upper inverted scan line.

The display device may further include a first emission control line extending in a direction on the substrate, and receiving the first emission control signal, wherein the light blocking layer and the gate electrode of the second transistor may be electrically connected to the first emission control line.

The first emission control line may include: a lower first emission control line; and an upper first emission control line that may overlap the lower first emission control line, the lower first emission control line, the light blocking layer of the second transistor and the gate electrode of the driving transistor may be positioned on a same layer, the upper first emission control line and the gate electrode of the second transistor may be positioned on a same layer, the upper first emission control line may overlap the lower first emission control line, the light blocking layer of the second transistor may be electrically connected to the lower first emission control line, and the gate electrode of the second transistor may be electrically connected to the upper first emission control line.

An embodiment may provide a display device that may include: a light emitting diode electrically connected between a driving voltage line that transmits a driving voltage and a common voltage line that transmits a common voltage; a driving transistor electrically connected between the driving voltage line and the light emitting diode; a first transistor electrically connected between the first electrode of the driving transistor electrically connected to the driving voltage line and a data line that transmits a data voltage; a second transistor electrically connected between a second electrode of the driving transistor electrically connected to the light emitting diode and a gate electrode of the driving transistor; a third transistor electrically connected between the light emitting diode and an initialization voltage line that transmits an initialization voltage; and a storage capacitor electrically connected between the driving voltage line and the gate electrode of the driving transistor, wherein the driving transistor may include a polycrystalline semiconductor, and the second transistor and the third transistor may include oxide semiconductors.

The display device may further include: a fourth transistor and a fifth transistor electrically connected between the driving voltage line and the first electrode of the driving transistor; a sixth transistor electrically connected between the second electrode of the driving transistor and the light emitting diode; a seventh transistor electrically connected between a gate electrode of the fourth transistor and a second electrode of the driving transistor; a first emission control signal line electrically connected to the gate electrode of the fourth transistor and a gate electrode of the third transistor, and receiving a first emission control signal; a second emission control signal line electrically connected to a gate electrode of the sixth transistor and a gate electrode of the fifth transistor, and receiving a second emission control signal; and a third emission control signal line electrically connected to the gate electrode of the seventh transistor, and receiving a third emission control signal.

The display device may further include: a scan line electrically connected to a gate electrode of the first transistor, and receiving a scan signal; and an inverted scan line electrically connected to a gate electrode of the second transistor, and receiving an inverted scan signal, wherein a voltage with opposite polarity to the voltage applied to the scan line at a same time may be applied to the inverted scan line.

The display device may further include a boost capacitor electrically connected between a gate electrode of the first transistor and a gate electrode of the driving transistor.

The driving transistor may be a p-type transistor, and the second transistor and the third transistor may be an n-type transistor.

According to embodiments, the display device may be stably driven, reliability may be improved, and power consumption may be reduced.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
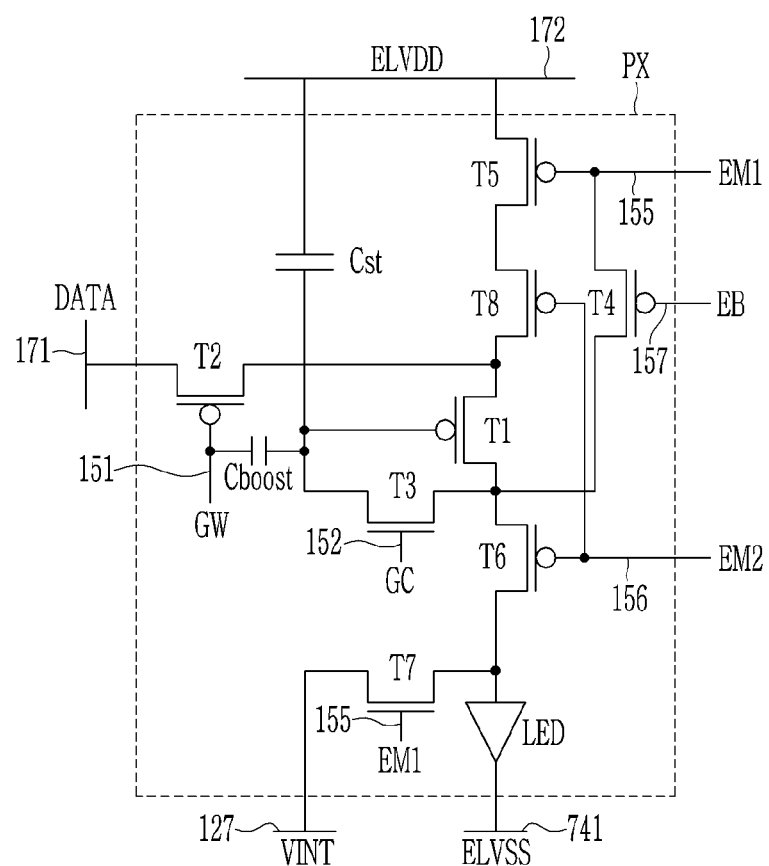
FIG. 1 shows an equivalent circuit diagram of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

The drawings and description are to be regarded as illustrative in nature and not restrictive, and like reference numerals designate like elements throughout the specification.

The size and thickness of each configuration shown in the drawings are arbitrarily shown for better understanding and ease of description, and the disclosure is not limited thereto. In the drawings, the thickness of layers, films, panels, regions, etc., are exaggerated for clarity. For better understanding and ease of description, the thicknesses of some layers and areas are exaggerated.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A pixel of a display device according to an embodiment will now be described with reference to FIG. 1

FIG. 1 shows an equivalent circuit diagram of a display device according to an embodiment. One pixel PX of the display device according to an embodiment may include transistors T1, T2, T3, T4, T5, T6, T7, and T8 electrically connected to various signal lines 127, 151, 152, 155, 156, 157, 171, 172, and 741, a storage capacitor Cst, a boost capacitor (Cboost), and a light emitting diode (LED).

The display device may include a display area that may display images, and the pixel PX may be arranged or disposed in the display area in various forms.

Transistors T1, T2, T3, T4, T5, T6, T7, and T8 may include a driving transistor T1, and may include a second transistor T2 and a third transistor T3 that may be switching transistors. The other transistors may be compensation transistors, and may include the fourth transistor T4, the fifth transistor T5, the sixth transistor T6, the seventh transistor T7, and the eighth transistor T8. It is to be understood, however, that the naming of the transistors may be arbitrary and are described herein for convenience and ease of description.

Signal lines 127, 151, 152, 155, 156, 157, 171, 172, and 741 may include an initialization voltage line 127, a scan line 151, an inverted scan line 152, a first emission control line 155, a second emission control line 156, a third emission control line 157, a data line 171, a driving voltage line 172, and a common voltage line 741.

The scan line 151 may be electrically connected to a gate driver (not shown) and may transmit a scan signal (GW) to the second transistor T2. The inverted scan line 152 may receive a voltage with opposite polarity to a voltage applied to the scan line 151 at the same time as the signal of the scan line 151. For example, in a case that a high voltage is applied to the scan line 151, a low voltage may be applied to the inverted scan line 152. The inverted scan line 152 may transmit an inverted scan signal (GC) to the third transistor T3.

The first emission control line 155 may transmit a first emission control signal EM1 to the fifth transistor T5. The second emission control line 156 may transmit a second emission control signal EM2 to the sixth transistor T6 and the seventh transistor T7. The third emission control line 157 may transmit a third emission control signal (EB) to the fourth transistor T4.

The data line 171 may be a wire that may transmit a data voltage (DATA) generated by a data driver (not shown), and luminance of light emitted by the light emitting diode (LED) may change according to the data voltage (DATA) applied to the pixel PX.

The driving voltage line 172 may apply a driving voltage (ELVDD). The initialization voltage line 127 may transmit an initialization voltage (VINT). The common voltage line 741 may apply a common voltage (ELVSS) to a cathode of the light emitting diode (LED). In an embodiment, voltages applied to the driving voltage line 172, the initialization voltage line 127, and the common voltage line 741 may be, respectively, a constant voltage.

A configuration and a connection relationship of the transistors will now be described in detail.

The driving transistor T1 may have a p-type transistor characteristic, and may include a polycrystalline semiconductor. The driving transistor T1 may control a size of a current output to an anode of the light emitting diode (LED) according to the data voltage (DATA) applied to a gate electrode of the driving transistor T1. Brightness of the light emitting diode (LED) may be controlled by the size of a driving current output to the anode of the light emitting diode (LED), so that luminance of the light emitting diode (LED) may be controlled according to the data voltage (DATA) applied to the pixel PX. For this purpose, a first electrode of the driving transistor T1 may receive the driving voltage (ELVDD), and may be electrically connected to the driving voltage line 172 through the fifth transistor T5 and the eighth transistor T8. The first electrode of the driving transistor T1 may be electrically connected to a second electrode of the second transistor T2 to receive the data voltage (DATA). The second electrode of the driving transistor T1 may output a current to the light emitting diode (LED), and may be electrically connected to the anode of the light emitting diode (LED) through the sixth transistor T6. The second electrode of the driving transistor T1 may transmit the data voltage (DATA) applied to the first electrode to the third transistor T3. A gate electrode of the driving transistor T1 may be electrically connected to one electrode (hereinafter, a second storage electrode) of the storage capacitor Cst. A voltage at the gate electrode of the driving transistor T1 may change according to the voltage stored in the storage capacitor Cst, and the driving current output by the driving transistor T1 accordingly may change. The storage capacitor Cst may also maintain the voltage at the gate electrode of the driving transistor T1 for one frame.

The second transistor T2 may have a p-type transistor characteristic, and may include a polycrystalline semiconductor. The second transistor T2 may receive the data voltage (DATA) into the pixel PX. A gate electrode of the second transistor T2 may be electrically connected to the scan line 151 and the first electrode of the boost capacitor (Cboost). A first electrode of the second transistor T2 may be electrically connected to the data line 171. A second electrode of the second transistor T2 may be electrically connected to the first electrode of the driving transistor T1. In a case that the second transistor T2 is turned on by a low voltage from among the scan signal (GW) transmitted through the scan line 151, the data voltage (DATA) transmitted through the data line 171 may be transmitted to the first electrode of the driving transistor T1.

The third transistor T3 may have an n-type transistor characteristic, and may include an oxide semiconductor. The third transistor T3 may electrically connect the second electrode of the driving transistor T1 and the gate electrode of the driving transistor T1. As a result, the third transistor T3 may transmit a compensation voltage that may be changed in a case that the data voltage (DATA) passes through the driving transistor T1 to the second storage electrode of the storage capacitor Cst. A gate electrode of the third transistor T3 may be electrically connected to the inverted scan line 152, and the first electrode of the third transistor T3 may be electrically connected to the second electrode of the driving transistor T1. A second electrode of the third transistor T3 may be electrically connected to the second storage electrode of the storage capacitor Cst, the gate electrode of the driving transistor T1, and the second electrode of the boost capacitor (Cboost). The third transistor T3 may be turned on by a high voltage from among the inverted scan signal (GC) transmitted through the inverted scan line 152, to electrically connect the gate electrode of the driving transistor T1 and the second electrode of the driving transistor T1, and to transmit the voltage applied to the gate electrode of the driving transistor T1 to the second storage electrode of the storage capacitor Cst and store the same in the storage capacitor Cst.

The fourth transistor T4 may have a p-type transistor characteristic, and may include a polycrystalline semiconductor. A gate electrode of the fourth transistor T4 may be electrically connected to the third emission control line 157. A first electrode of the fourth transistor T4 may be electrically connected to the first emission control line 155. A second electrode of the fourth transistor T4 may be electrically connected to the second electrode of the driving transistor T1, the first electrode of the third transistor T3, and the first electrode of the sixth transistor T6. In a case that the fourth transistor T4 is turned on by the low voltage from among the third emission control signal (EB) transmitted through the third emission control line 157, the first emission control signal EM1 transmitted through the first emission control line 155 may be transmitted to the first electrode of the sixth transistor T6.

The fifth transistor T5 may have a p-type transistor characteristic, and may include a polycrystalline semiconductor. The fifth transistor T5 may transmit the driving voltage (ELVDD) to the driving transistor T1 through the eighth transistor T8. A gate electrode of the fifth transistor T5 may be electrically connected to the first emission control line 155. A first electrode of the fifth transistor T5 may be electrically connected to the driving voltage line 172. A second electrode of the fifth transistor T5 may be electrically connected to the first electrode of the eighth transistor T8.

The sixth transistor T6 may have a p-type transistor characteristic, and may include a polycrystalline semiconductor. The sixth transistor T6 may transmit the driving current output by the driving transistor T1 to the light emitting diode (LED). A gate electrode of the sixth transistor T6 may be electrically connected to the second emission control line 156. A first electrode of the sixth transistor T6 may be electrically connected to the second electrode of the driving transistor T1. A second electrode of the sixth transistor T6 may be electrically connected to the anode of the light emitting diode (LED).

The seventh transistor T7 may have an n-type transistor characteristic, and may include an oxide semiconductor. The seventh transistor T7 may initialize the anode of the light emitting diode (LED). A gate electrode of the seventh transistor T7 may be electrically connected to the first emission control line 155. A first electrode of the seventh transistor T7 may be electrically connected to the anode of the light emitting diode (LED). A second electrode of the seventh transistor T7 may be electrically connected to the initialization voltage line 127. In a case that the seventh transistor T7 is turned on by the high voltage from among the first emission control signal EM1 transmitted through the first emission control line 155, the initialization voltage (VINT) may be applied to the anode of the light emitting diode (LED) to be initialized.

The eighth transistor T8 may have a p-type transistor characteristic, and may include a polycrystalline semiconductor. A gate electrode of the eighth transistor T8 may be electrically connected to the second emission control line 156. A first electrode of the eighth transistor T8 may be electrically connected to the second electrode of the fifth transistor T5. A second electrode of the eighth transistor T8 may be electrically connected to the first electrode of the driving transistor T1 and the second electrode of the second transistor T2. In a case that the eighth transistor T8 is turned on by the low voltage from among the second emission control signal EM2 transmitted through the second emission control line 156, the driving voltage (ELVDD) transmitted through the fifth transistor T5 may be transmitted to the first electrode of the driving transistor T1.

It has been described that one pixel PX may include eight transistors T1, T2, T3, T4, T5, T6, T7, and T8, one storage capacitor Cst, and one boost capacitor (Cboost), but the disclosure is not limited thereto, and the number of transistors, the number of capacitors, and their connection relationships are modifiable in various ways.

In an embodiment, the driving transistor T1 may include a polycrystalline semiconductor. The third transistor T3 and the seventh transistor T7 may include oxide semiconductors. The second transistor T2, the fourth transistor T4, the fifth transistor T5, the sixth transistor T6, and the eighth transistor T8 may include polycrystalline semiconductors. However, they are not limited thereto, and at least any one of the second transistor T2, the fourth transistor T4, the fifth transistor T5, the sixth transistor T6, and the eighth transistor T8 may include oxide semiconductors. In an embodiment, the third transistor T3 and the seventh transistor T7 may include semiconductor materials that may be different from the driving transistor T1, so that they may further drive stably and reliability may be improved.

As described above, in a case that a high voltage may be applied to the scan line 151, a low voltage may be applied to the inverted scan line 152, and in a case that a low voltage may be applied to the scan line 151, a high voltage may be applied to the inverted scan line 152. The inverted scan signal (GC) applied to the inverted scan line 152 may include a scan signal (GW) applied to the scan line 151 and an inverted signal, thereby lowering the gate voltage of the driving transistor T1 after the data are programmed. On the contrary, the scan signal (GW) may raise the gate voltage of the driving transistor T1. Hence, in a case that a black voltage is programmed, the black voltage may be reduced. In an embodiment, by positioning the boost capacitor (Cboost) between the scan line 151 that may apply a scan signal (GW) and the gate electrode of the driving transistor T1, the gate voltage of the driving transistor T1 may be increased to thus stably output a black voltage. As capacitance of the boost capacitor (Cboost) increases, the gate voltage of the driving transistor T1 may be further increased. The gate voltage of the driving transistor T1 may be controlled by controlling the capacitance of the boost capacitor (Cboost).

A planar and schematic cross-sectional configuration of the driving transistor T1, the third transistor T3, and the seventh transistor T7 will now be described in further detail with reference to FIG. 2 to FIG. 9.

Figure 2:
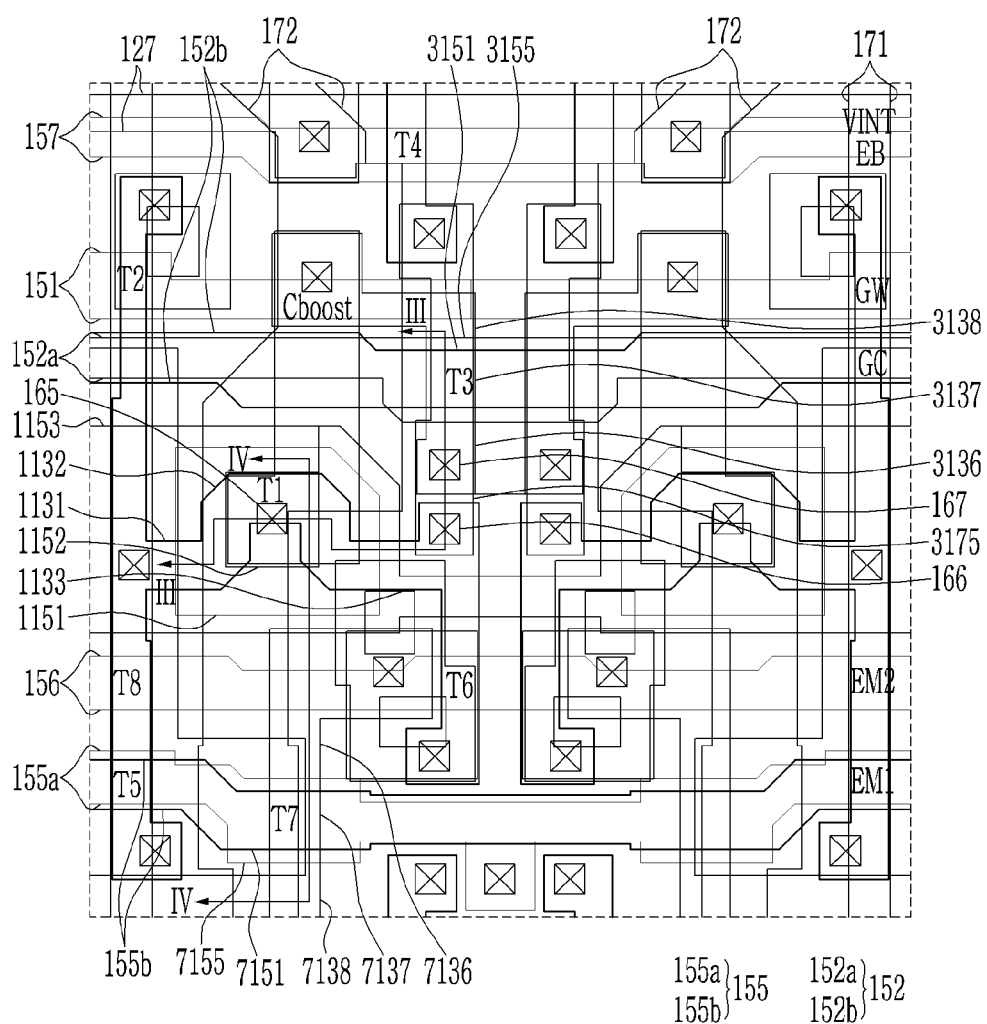
FIG. 2 shows a top plan view of a display device according to an embodiment.
Figure 3:
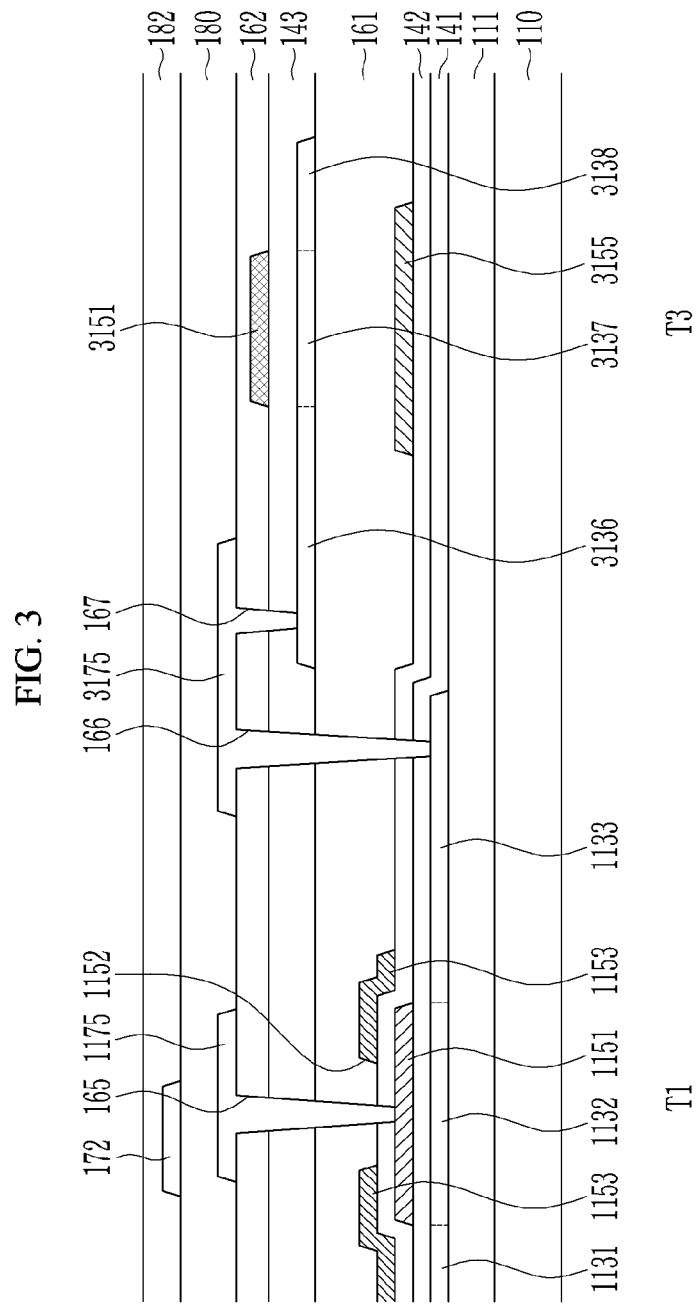
FIG. 3 shows a schematic cross-sectional view with respect to a line of FIG. 2.
Figure 4:
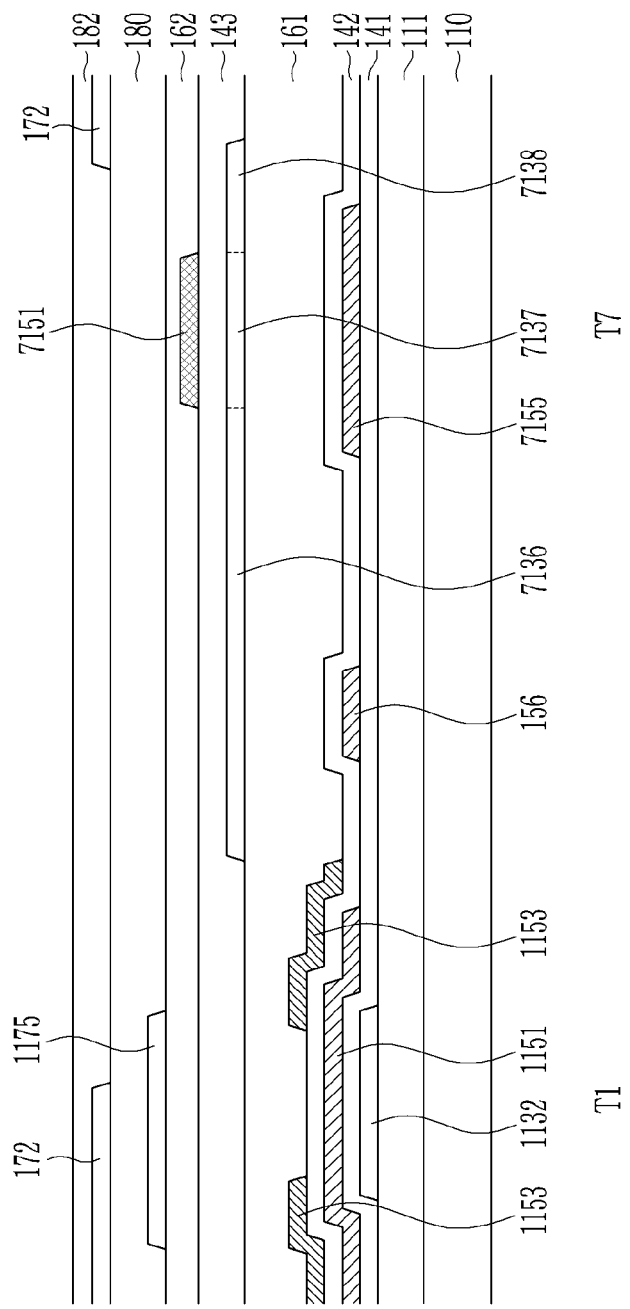
FIG. 4 shows a schematic cross-sectional view with respect to a line IV-IV of FIG. 2.

FIG. 2 shows a top plan view of a display device according to an embodiment, FIG. 3 shows a schematic cross-sectional view with respect to a line of FIG. 2, and FIG. 4 shows a schematic cross-sectional view with respect to a line IV-IV of FIG. 2. FIG. 5 to FIG. 9 show sequential top plan views following an order of manufacturing a display device according to an embodiment. FIG. 2 to FIG. 9 show two adjacent pixels which may have shapes that may be substantially symmetrical to each other. The pixel positioned on the left will be mainly described.

Figure 5:
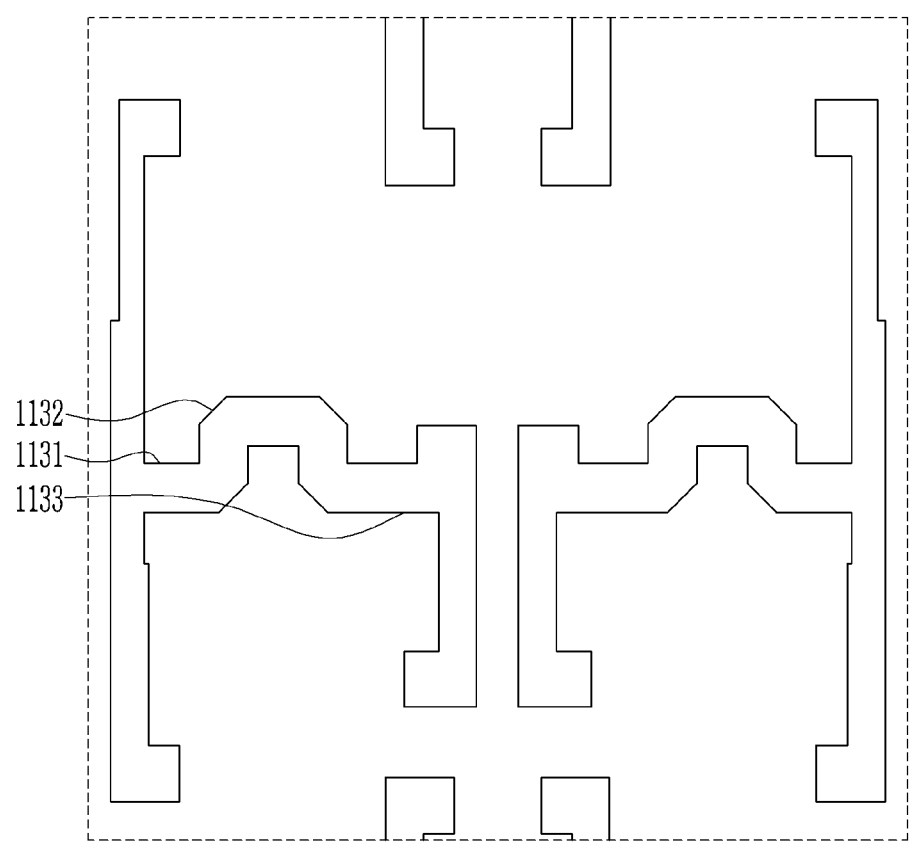
FIG. 5 shows a top plan view of a polycrystalline semiconductor of a display device according to an embodiment.

As shown in FIG. 2 to FIG. 9, a polycrystalline semiconductor including a channel 1132, a first electrode 1131, and a second electrode 1133 of the driving transistor T1 may be positioned or disposed on the substrate 110. FIG. 5 shows a polycrystalline semiconductor. The polycrystalline semiconductor may include channels, first electrodes, and second electrodes of the second transistor T2, the fourth transistor T4, the fifth transistor T5, the sixth transistor T6, and the eighth transistor T8 in addition to those of the driving transistor T1.

The channel 1132 of the driving transistor T1 may be bent in a plan view. The shape of the channel 1132 of the driving transistor T1 is not limited thereto, and it is modifiable in various ways. For example, the channel 1132 of the driving transistor T1 may be bent in another shape, and/or it may have a bar shape. The first electrode 1131 and the second electrode 1133 of the driving transistor T1 may be positioned or disposed on respective sides of the channel 1132 of the driving transistor T1. The first electrode 1131 of the driving transistor T1 may extend from top to bottom in a plan view, and a portion extending upward may be electrically connected to the second electrode of the second transistor T2, while a portion extending downward may be electrically connected to the second electrode of the eighth transistor T8. The second electrode 1133 of the driving transistor T1 may extend downward in a plan view and may be electrically connected to the first electrode of the sixth transistor T6.

A buffer layer 111 may be positioned or disposed between the substrate 110 and the polycrystalline semiconductor including the channel 1132, the first electrode 1131, and the second electrode 1133 of the driving transistor T1. The buffer layer 111 may have a single-layered or multi-layered structure. The buffer layer 111 may include an organic insulating material or an inorganic insulating material.

A first gate insulating layer 141 may be positioned or disposed on the polycrystalline semiconductor including the channel 1132, the first electrode 1131, and the second electrode 1133 of the driving transistor T1. The first gate insulating layer 141 may include a silicon nitride or a silicon oxide.

Figure 6:
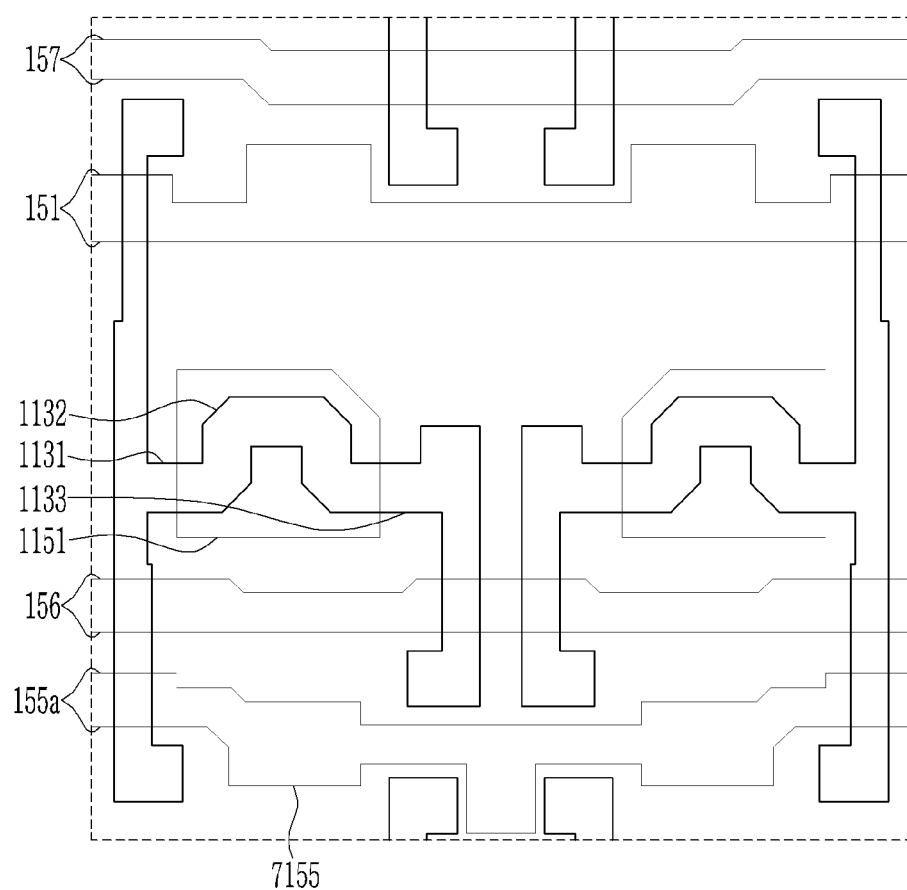
FIG. 6 shows a top plan view of a polycrystalline semiconductor and a first gate conductor of a display device according to an embodiment.

A first gate conductor including the gate electrode 1151 of the driving transistor T1 and the light blocking layer 7155 of the seventh transistor T7 may be positioned or disposed on the first gate insulating layer 141. FIG. 6 shows a polycrystalline semiconductor and a first gate conductor. The first gate conductor may include a scan line 151, a lower first emission control line 155a, a second emission control line 156, and a third emission control line 157. The first gate conductor may include the gate electrode of the second transistor T2, the gate electrode of the fourth transistor T4, the gate electrode of the fifth transistor T5, the gate electrode of the sixth transistor T6, the gate electrode of the eighth transistor T8, and the first electrode of the boost capacitor (Cboost).

The gate electrode 1151 of the driving transistor T1 may overlap the channel 1132 of the driving transistor T1. The channel 1132 of the driving transistor T1 may be covered or overlapped by the gate electrode 1151 of the driving transistor T1. The light blocking layer 7155 of the seventh transistor T7 may overlap the channel 7137 and the gate electrode 7151 of the seventh transistor T7. The light blocking layer 7155 of the seventh transistor T7 may be electrically connected to the first emission control line 155. In this instance, the light blocking layer 7155 of the seventh transistor T7 may be electrically connected to the lower first emission control line 155a. The scan line 151, the lower first emission control line 155a, the second emission control line 156, and the third emission control line 157 may substantially extend in a horizontal direction. The gate electrode of the second transistor T2 and the first electrode of the boost capacitor (Cboost) may be electrically connected to the scan line 151. The gate electrode of the fourth transistor T4 may be electrically connected to the third emission control line 157. The gate electrode of the fifth transistor T5 may be electrically connected to the first emission control line 155. In this instance, the gate electrode of the fifth transistor T5 may be electrically connected to the lower first emission control line 155a. The gate electrode of the sixth transistor T6 and the gate electrode of the eighth transistor T8 may be electrically connected to the second emission control line 156.

A first gate conductor including the gate electrode 1151 of the driving transistor T1 and the light blocking layer 7155 of the seventh transistor T7 may be formed, and a doping process may be performed. A portion or a region of the polycrystalline semiconductor covered or overlapped by the first gate conductor may be doped, and a portion or a region of the polycrystalline semiconductor not covered or overlapped by the first gate conductor may be doped, thereby having a same characteristic as the conductor. In this instance, the doping process may be performed with a p-type dopant, and the driving transistor T1 including a polycrystalline semiconductor, the second transistor T2, the fourth transistor T4, the fifth transistor T5, the sixth transistor T6, and the eighth transistor T8 may have a p-type transistor characteristic.

A second gate insulating layer 142 may be positioned or disposed on the first gate conductor including the gate electrode 1151 of the driving transistor T1 and the light blocking layer 7155 of the seventh transistor T7 and the first gate insulating layer 141. The second gate insulating layer 142 may include a silicon nitride or a silicon oxide.

Figure 7:
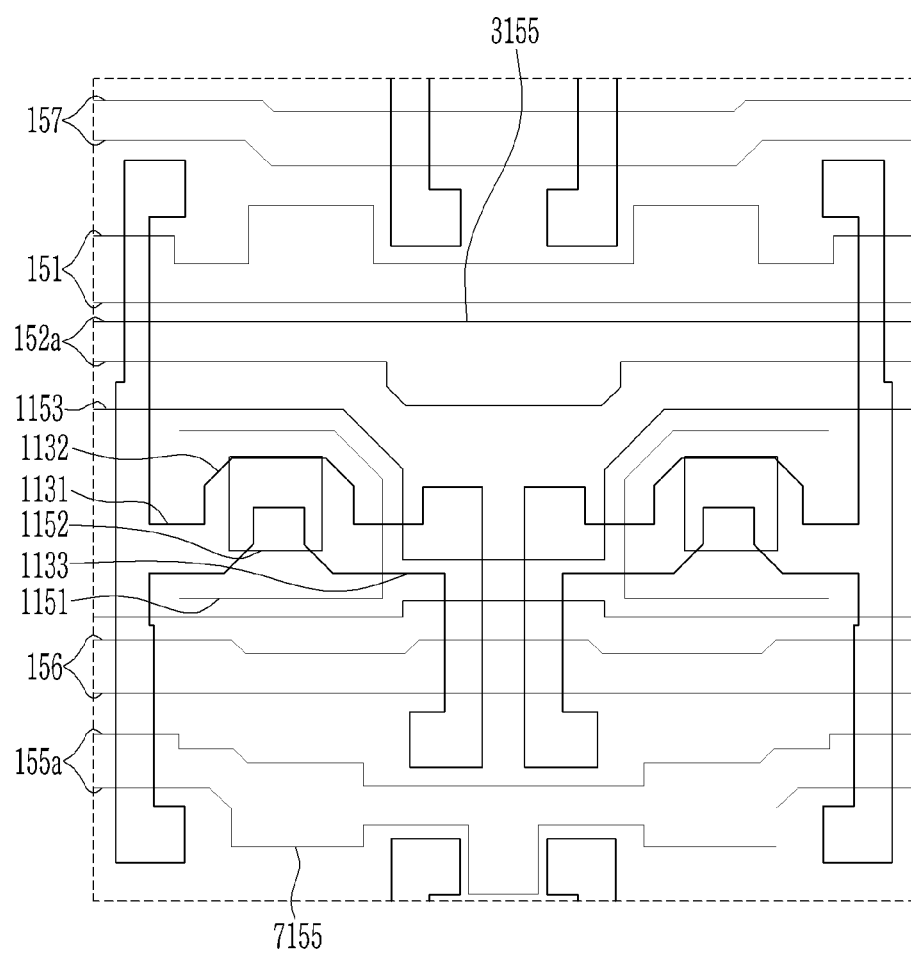
FIG. 7 shows a top plan view of a polycrystalline semiconductor, a first gate conductor, and a second gate conductor of a display device according to an embodiment.

A second gate conductor including the first storage electrode 1153 of the storage capacitor Cst and the light blocking layer 3155 of the third transistor T3 may be positioned or disposed on the second gate insulating layer 142. FIG. 7 shows a polycrystalline semiconductor, a first gate conductor, and a second gate conductor. The second gate conductor may include a lower inverted scan line 152a.

The first storage electrode 1153 may overlap the gate electrode 1151 of the driving transistor T1 to configure or form a storage capacitor Cst. An opening 1152 may be formed in the first storage electrode 1153 of the storage capacitor Cst. The opening 1152 of the first storage electrode 1153 of the storage capacitor Cst may overlap the gate electrode 1151 of the driving transistor T1. The light blocking layer 3155 of the third transistor T3 may overlap the channel 3137 and the gate electrode 3151 of the third transistor T3. The light blocking layer 3155 of the third transistor T3 may be electrically connected to the inverted scan line 152. The light blocking layer 3155 of the third transistor T3 may be electrically connected to the lower inverted scan line 152a. The lower inverted scan line 152a may substantially extend in the horizontal direction.

A first interlayer insulating layer 161 may be positioned or disposed on the second gate conductor including the first storage electrode 1153 of the storage capacitor Cst and the light blocking layer 3155 of the third transistor T3. The first interlayer insulating layer 161 may include a silicon nitride or a silicon oxide.

Figure 8:
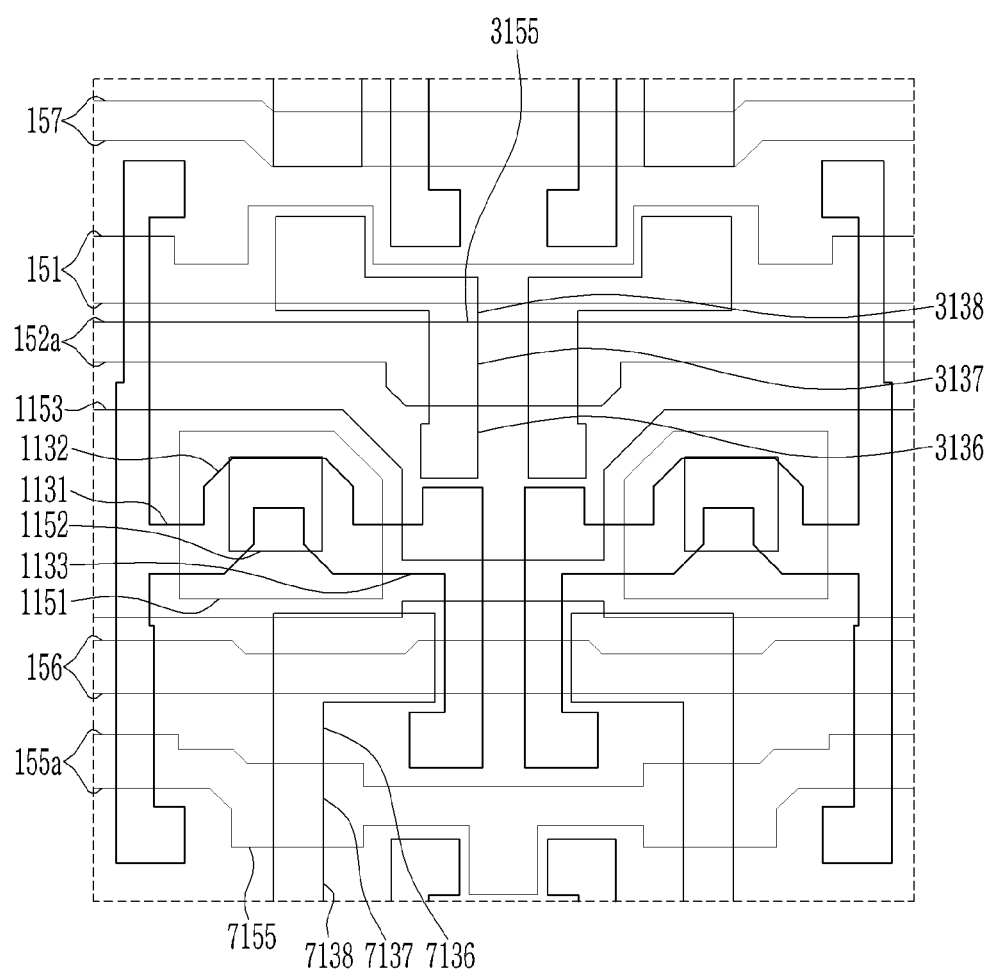
FIG. 8 shows a top plan view of a polycrystalline semiconductor, a first gate conductor, a second gate conductor, and an oxide semiconductor.

An oxide semiconductor including the channel 3137 of the third transistor T3, the first electrode 3136, the second electrode 3138, the channel 7137 of the seventh transistor T7, the first electrode 7136, and the second electrode 7138 may be positioned or disposed on the first interlayer insulating layer 161. FIG. 8 shows a top plan view of a polycrystalline semiconductor, a first gate conductor, a second gate conductor, and an oxide semiconductor. The oxide semiconductor may include a second electrode of the boost capacitor (Cboost).

The oxide semiconductor may include: at least one of unary metal oxides such as an indium (In) oxide, a tin (Sn) oxide, or a zinc (Zn) oxide; binary metal oxides such as an In—Zn based oxide, a Sn—Zn based oxide, an Al—Zn based oxide, a Zn—Mg based oxide, a Sn—Mg based oxide, an In—Mg based oxide, or an In—Ga based oxide; ternary metal oxides such as an In—Ga—Zn based oxide, an In—Al—Zn based oxide, an In—Sn—Zn based oxide, a Sn—Ga—Zn based oxide, an Al—Ga—Zn based oxide, a Sn—Al—Zn based oxide, an In—Hf—Zn based oxide, an In—La—Zn based oxide, an In—Ce—Zn based oxide, an In—Pr—Zn based oxide, an In—Nd—Zn based oxide, an In—Sm—Zn based oxide, an In—Eu—Zn based oxide, an In—Gd—Zn based oxide, an In—Tb—Zn based oxide, an In—Dy—Zn based oxide, an In—Ho—Zn based oxide, an In—Er—Zn based oxide, an In—Tm—Zn based oxide, an In—Yb—Zn based oxide, or an In—Lu—Zn based oxide; and quaternary metal oxides such as an In—Sn—Ga—Zn based oxide, an In—Hf—Ga—Zn based oxide, an In—Al—Ga—Zn based oxide, an In—Sn—Al—Zn based oxide, an In—Sn—Hf—Zn based oxide, or an In—Hf—Al—Zn based oxide. For example, the oxide semiconductor may include an indium-gallium-zinc oxide (IGZO) from among the In—Ga—Zn-based oxide.

The first electrode 3136 and the second electrode 3138 of the third transistor T3 may be positioned or disposed on respective sides of the channel 3137 of the third transistor T3. The channel 3137 of the third transistor T3 may overlap the light blocking layer 3155 of the third transistor T3. The light blocking layer 3155 of the third transistor T3 may be wider than the channel 3137. Therefore, the light blocking layer 3155 of the third transistor T3 may overlap part of the first electrode 3136 and part of the second electrode 3138 on respective sides of the channel 3137.

The first electrode 7136 and the second electrode 7138 of the seventh transistor T7 may be positioned or disposed on respective sides of the channel 7137 of the seventh transistor T7. The channel 7137 of the seventh transistor T7 may overlap the light blocking layer 7155 of the seventh transistor T7. The light blocking layer 7155 of the seventh transistor T7 may be wider than the channel 7137. Therefore, the light blocking layer 7155 of the seventh transistor T7 may overlap part of the first electrode 7136 and part of the second electrode 7138 on respective sides of the channel 7137.

The second electrode of the boost capacitor (Cboost) may be electrically connected to the second electrode 3138 of the third transistor T3. The second electrode of the boost capacitor (Cboost) may overlap the first electrode. Capacitance of the boost capacitor (Cboost) may be determined by an overlapping area of the first electrode and the second electrode of the boost capacitor (Cboost), and a thickness of the second gate insulating layer 142 and the first interlayer insulating layer 161 between the first electrode and the second electrode.

A third gate insulating layer 143 may be positioned or disposed on the oxide semiconductor including the channel 3137, the first electrode 3136, and the second electrode 3138 of the third transistor T3, and the channel 7137, the first electrode 7136, and the second electrode 7138 of the seventh transistor T7. The third gate insulating layer 143 may be disposed on a front side of the oxide semiconductor and the first interlayer insulating layer 161. The third gate insulating layer 143 may cover or overlap upper sides and lateral sides of the channel 3137, the first electrode 3136, and the second electrode 3138 of the third transistor T3, and the channel 7137, the first electrode 7136, and the second electrode 7138 of the seventh transistor T7. However, the disclosure is not limited thereto, and the third gate insulating layer 143 may not be disposed on the front sides of the oxide semiconductor and the first interlayer insulating layer 161. For example, the third gate insulating layer 143 may overlap the channel 3137 of the third transistor T3, and may not overlap the first electrode 3136 and the second electrode 3138. The third gate insulating layer 143 may overlap the channel 7137 of the seventh transistor T7, and may not overlap the first electrode 7136 and the second electrode 7138.

Figure 9:
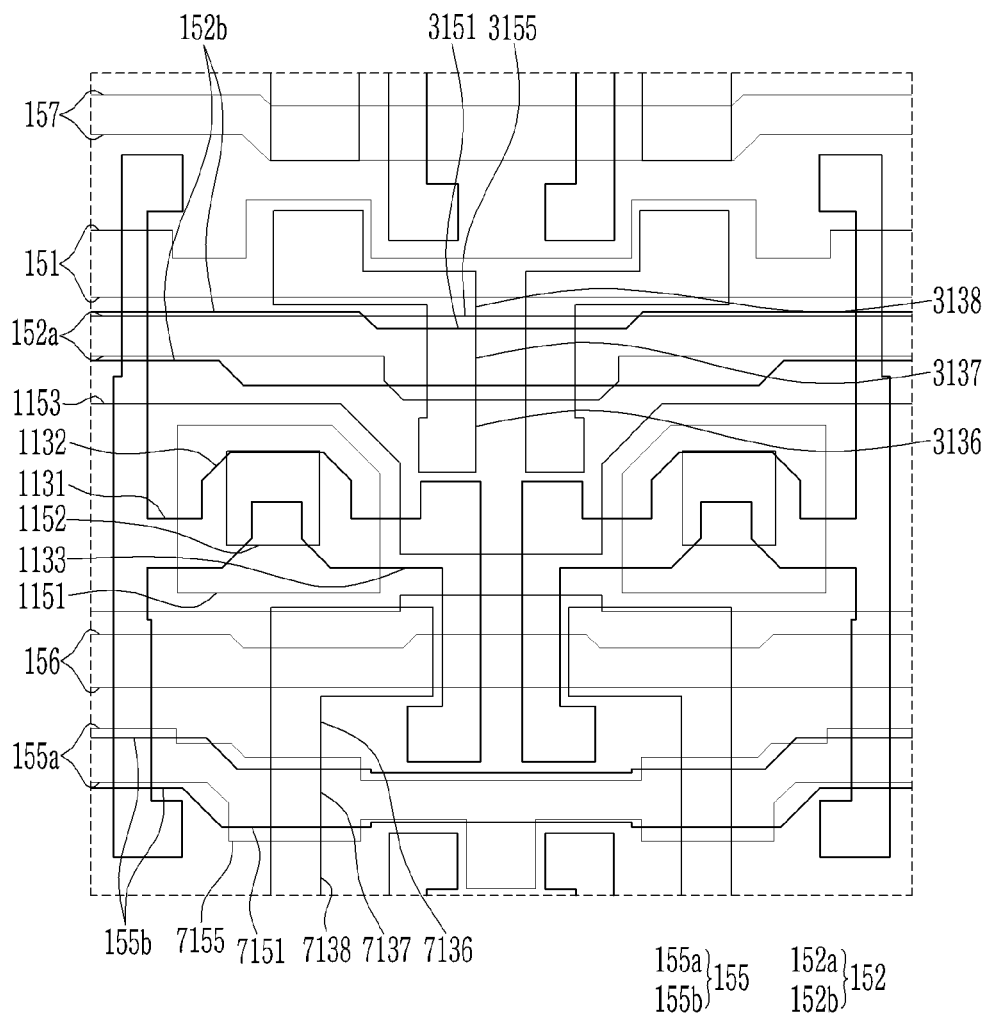
FIG. 9 shows a top plan view of a polycrystalline semiconductor, a first gate conductor, a second gate conductor, an oxide semiconductor, and a third gate conductor.

A third gate conductor including the gate electrode 3151 of the third transistor T3 and the gate electrode 7151 of the seventh transistor T7 may be positioned or disposed on the third gate insulating layer 143. FIG. 9 shows a polycrystalline semiconductor, a first gate conductor, a second gate conductor, an oxide semiconductor, and a third gate conductor. The third gate conductor may include an upper inverted scan line 152b and an upper first emission control line 155b.

The gate electrode 3151 of the third transistor T3 may overlap the channel 3137 of the third transistor T3 and the light blocking layer 3155. The gate electrode 3151 of the third transistor T3 may be electrically connected to the inverted scan line 152. Here, the gate electrode 3151 of the third transistor T3 may be electrically connected to the upper inverted scan line 152b. The light blocking layer 3155 and the gate electrode 3151 of the third transistor T3 may receive an inverted scan signal (GC) through the inverted scan line 152.

The gate electrode 7151 of the seventh transistor T7 may overlap the channel 7137 and the light blocking layer 7155 of the seventh transistor T7. The gate electrode 7151 of the seventh transistor T7 may be electrically connected to the first emission control line 155. In this instance, the gate electrode 7151 of the seventh transistor T7 may be electrically connected to the upper first emission control line 155b. The light blocking layer 7155 and the gate electrode 7151 of the seventh transistor T7 may receive a first emission control signal EM1 through the first emission control line 155b.

The upper inverted scan line 152b and the upper first emission control line 155b may substantially extend in the horizontal direction. The upper inverted scan line 152b may configure or form the inverted scan line 152 together with the lower inverted scan line 152a. The upper inverted scan line 152b may overlap the lower inverted scan line 152a. The upper first emission control line 155b may configure or form the first emission control line 155 together with the lower first emission control line 155b. The upper first emission control line 155b may overlap the lower first emission control line 155a.

A third gate conductor including the gate electrode 3151 of the third transistor T3 and the gate electrode 7151 of the seventh transistor T7 may be formed, and a doping process may then be performed. A portion of the oxide semiconductor covered or overlapped by the third gate conductor may not be doped, and a portion of the oxide semiconductor not covered or overlapped by the third gate conductor may be doped, thereby having a same characteristic as the conductor. The channel 3137 of the third transistor T3 may be below the gate electrode 3151 so that it may overlap the gate electrode 3151. The first electrode 3136 and the second electrode 3138 of the third transistor T3 may not overlap the gate electrode 3151. The channel 7137 of the seventh transistor T7 may be below the gate electrode 7151 so that it may overlap the gate electrode 7151. The first electrode 7136 and the second electrode 7138 of the seventh transistor T7 may not overlap the gate electrode 7151. The process for doping an oxide semiconductor may be performed with an n-type dopant, and the third transistor T3 and the seventh transistor T7 including oxide semiconductors may have an n-type transistor characteristic.

A second interlayer insulating layer 162 may be positioned or disposed on the third gate conductor including the gate electrode 3151 of the third transistor T3 and the gate electrode 7151 of the seventh transistor T7.

A first opening 165, a second opening 166, and a third opening 167 may be formed in the second interlayer insulating layer 162 and the third gate insulating layer 143. The first opening 165 may overlap at least part of the gate electrode 1151 of the driving transistor T1. The first opening 165 may be formed in the first interlayer insulating layer 161 and the second gate insulating layer 142 in addition to the second interlayer insulating layer 162 and the third gate insulating layer 143. The first opening 165 may overlap the opening 1152 of the first storage electrode 1153. The first opening 165 may be inside the opening 1152 of the first storage electrode 1153. The second opening 166 may overlap at least part of the second electrode 1133 of the driving transistor T1. The second opening 166 may be formed in the first interlayer insulating layer 161, the second gate insulating layer 142, and the first gate insulating layer 141 in addition to the second interlayer insulating layer 162 and the third gate insulating layer 143. The third opening 167 may overlap at least part of the first electrode 3136 of the third transistor T3.

A first connection electrode 1175 and a second connection electrode 3175 may be positioned or disposed on the second interlayer insulating layer 162. The first connection electrode 1175 may overlap the gate electrode 1151 of the driving transistor T1. The first connection electrode 1175 may be electrically connected to the gate electrode 1151 of the driving transistor T1 through the first opening 165. The first connection electrode 1175 may overlap the boost capacitor (Cboost). The first connection electrode 1175 may be electrically connected to the second electrode of the boost capacitor (Cboost). Therefore, the gate electrode 1151 of the driving transistor T1 may be electrically connected to the second electrode of the boost capacitor (Cboost) by the first connection electrode 1175. The second connection electrode 3175 may overlap the second electrode 1133 of the driving transistor T1. The second connection electrode 3175 may be electrically connected to the second electrode 1133 of the driving transistor T1 through the second opening 166. The second connection electrode 3175 may overlap the first electrode 3136 of the third transistor T3. The second connection electrode 3175 may be electrically connected to the first electrode 3136 of the third transistor T3 through the third opening 167. Therefore, the second electrode 1133 of the driving transistor T1 may be electrically connected to the first electrode 3136 of the third transistor T3 by the second connection electrode 3175.

A third interlayer insulating layer 180 may be positioned or disposed on the first connection electrode 1175 and the second connection electrode 3175.

The data line 171 and the driving voltage line 172 may be disposed on the third interlayer insulating layer 180. The data line 171 and the driving voltage line 172 may substantially extend in a vertical direction. The data line 171 may be electrically connected to the second transistor T2. The driving voltage line 172 may be electrically connected to the first electrode of the fifth transistor T5. The driving voltage line 172 may be electrically connected to the first storage electrode 1153 of the storage capacitor Cst. The first storage electrodes 1153 of the storage capacitors Cst of adjacent pixels may be electrically connected to each other, and they may substantially extend in the horizontal direction.

A passivation layer 182 may be positioned or disposed on the data line 171 and the driving voltage line 172. Although not shown, an anode may be positioned or disposed on the passivation layer 182. The anode may be electrically connected to the sixth transistor T6, and may receive an output current of the driving transistor T1. A partition wall may be disposed on the anode. An opening may be formed in the partition wall, and the opening in the partition wall may overlap the anode. A light-emitting device layer may be disposed in the opening in the partition wall. A cathode may be disposed on the light-emitting device layer and the partition wall. The anode, the light-emitting device layer, and the cathode may configure or form a light emitting diode (LED).

Regarding the display device according to an embodiment, the driving transistor T1 may include a polycrystalline semiconductor, and the third transistor T3 and the seventh transistor T7 may include oxide semiconductors. As the third transistor T3 and the seventh transistor T7 include the semiconductor materials that may be different from the driving transistor T1, they may be stably driven, and reliability may be improved.

In an embodiment, the third transistor T3 including an oxide semiconductor may include a light blocking layer 3155. The light blocking layer 3155 of the third transistor T3 may be disposed on a same layer as the first storage electrode 1153 of the storage capacitor Cst, they may be made of a same or similar material, and they may be generated with a same process. The light blocking layer 3155 of the third transistor T3 may be disposed on a same layer as the inverted scan line 152, for example, the lower inverted scan line 152a, they may be made of a same or similar material, and they may be generated with a same process. The light blocking layer 3155 of the third transistor T3 may be electrically connected to the inverted scan line 152, and may receive an inverted scan signal (GC) from the inverted scan line 152. The light blocking layer 3155 of the third transistor T3 may receive a same signal as the gate electrode 3151, and the third transistor T3 may have a double-gate structure. As described, the third transistor T3 may have a configuration including the light blocking layer 3155 without an additional process, thereby preventing a leakage current. Hence, the device characteristic and reliability may be improved.

The seventh transistor T7 including an oxide semiconductor may include a light blocking layer 7155. The light blocking layer 7155 of the seventh transistor T7 may be disposed on a same layer as the gate electrode 1151 of the driving transistor T1, they may be made of a same or similar material, and they may be generated with a same process. The light blocking layer 7155 of the seventh transistor T7 may be disposed on a same layer as the first emission control line 155, for example, the lower first emission control line 155a, they may be made of a same or similar material, and they may be generated with a same process. The light blocking layer 7155 of the seventh transistor T7 may be electrically connected to the first emission control line 155, and may receive a first emission control signal EM1 from the first emission control line 155. The light blocking layer 7155 of the seventh transistor T7 may receive a same signal as the gate electrode 7151, and the seventh transistor T7 may have a double-gate structure. As described, the seventh transistor T7 may have a configuration including the light blocking layer 7155 without an additional process, thereby preventing a leakage current. Hence, the device characteristic and reliability may be improved.

The seventh transistor T7 may include an oxide semiconductor, and may have an n-type transistor characteristic. The seventh transistor T7 may be turned on by the high voltage from among the first emission control signal EM1 transmitted through the first emission control line 155. Therefore, compared to the case in which the seventh transistor T7 may include a polycrystalline semiconductor and may have a p-type transistor characteristic, the low voltage from among the signal applied to the gate electrode of the seventh transistor T7 may be further increased. For example, in a case that the seventh transistor T7 may include a polycrystalline semiconductor and has a p-type transistor characteristic, it may be turned on by the low voltage, and the low voltage may be about −8.5 V to turn on the seventh transistor T7. The seventh transistor T7 of the display device according to an embodiment may be turned on by the high voltage, and the low voltage from among the signal applied to the gate electrode of the seventh transistor T7 may increase up to about −6 V. According to the increase of the low voltage, the driving voltage of the display device may be reduced, and power consumption may be reduced.

While this disclosure has been described according to embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a light emitting diode electrically connected between a driving voltage line that transmits a driving voltage and a common voltage line that transmits a common voltage;
a driving transistor electrically connected between the driving voltage line and the light emitting diode;
a first transistor electrically connected between a first electrode of the driving transistor electrically connected to the driving voltage line and a data line that transmits a data voltage;
a second transistor electrically connected between a second electrode of the driving transistor electrically connected to the light emitting diode and a gate electrode of the driving transistor;
a third transistor electrically connected between the light emitting diode and an initialization voltage line that transmits an initialization voltage; and
a storage capacitor electrically connected between the driving voltage line and the gate electrode of the driving transistor, wherein
the driving transistor includes a polycrystalline semiconductor,
the third transistor includes oxide semiconductors,
the storage capacitor includes a first storage electrode and a second storage electrode,
the first storage electrode is the gate electrode of the driving transistor,
the second storage electrode is disposed on the first storage electrode, and
the third transistor includes a light blocking layer disposed on a same layer as the gate electrode of the driving transistor.

2. The display device of claim 1, further comprising:
a fourth transistor and a fifth transistor electrically connected between the driving voltage line and the first electrode of the driving transistor;
a sixth transistor electrically connected between the second electrode of the driving transistor and the light emitting diode;
a seventh transistor electrically connected between a gate electrode of the fourth transistor and the second electrode of the driving transistor;
a first emission control signal line electrically connected to the gate electrode of the fourth transistor and a gate electrode of the third transistor, and receiving a first emission control signal;
a second emission control signal line electrically connected to a gate electrode of the sixth transistor and a gate electrode of the fifth transistor, and receiving a second emission control signal; and
a third emission control signal line electrically connected to a gate electrode of the seventh transistor, and receiving a third emission control signal.

3. The display device of claim 2, further comprising:
a storage capacitor electrically connected between the driving voltage line and the gate electrode of the driving transistor.

4. The display device of claim 3, further comprising:
a scan line electrically connected to a gate electrode of the first transistor, and receiving a scan signal; and
an inverted scan line electrically connected to a gate electrode of the second transistor, and receiving an inverted scan signal, wherein
a voltage with opposite polarity to the voltage applied to the scan line at a same time is applied to the inverted scan line.

5. The display device of claim 1, wherein the second transistor includes oxide semiconductors.

6. The display device of claim 5, wherein the second transistor includes a light blocking layer disposed on a same layer as the gate electrode of the driving transistor.

7. The display device of claim 6, wherein
the driving transistor is a p-type transistor, and
the second transistor and the third transistor are an n-type transistor.

8. The display device of claim 6, wherein
the second transistor further includes a gate electrode, and a channel disposed between the light blocking layer of the second transistor and the gate electrode of the second transistor, and
the third transistor further includes a gate electrode, and a channel disposed between the light blocking layer of the third transistor and the gate electrode of the third transistor.

9. The display device of claim 8, wherein the gate electrode of the second transistor and the gate electrode of the third transistor are disposed on a same layer.

10. The display device of claim 8, wherein
the light blocking layer of the second transistor overlaps the channel of the second transistor and the gate electrode of the second transistor, and
the light blocking layer of the third transistor overlaps the channel of the third transistor and the gate electrode of the third transistor.

* * * * *